(12) United States Patent
Tsai et al.

(10) Patent No.: US 7,597,369 B2
(45) Date of Patent: Oct. 6, 2009

(54) CLAMP TOOL FOR CIRCUIT BOARD

(75) Inventors: Chun-Chi Tsai, Guangdong (CN);
Jian-Hua Xiang, Guangdong (CN);
Guan-Wu Xu, Guangdong (CN)

(73) Assignees: Hong Fu Jin Precision Industry (Shen Zhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 187 days.

(21) Appl. No.: 11/753,581

(22) Filed: May 25, 2007

(65) Prior Publication Data

US 2008/0006977 A1    Jan. 10, 2008

(30) Foreign Application Priority Data

Jul. 5, 2006    (CN) .................. 2006 2 0016836 U

(51) Int. Cl.
*B65G 7/00* (2006.01)
(52) U.S. Cl. ........................................ 294/15; 294/158
(58) Field of Classification Search .................. 294/1.1, 294/15, 86.4, 93, 103.1, 158, 902; 29/278, 29/758, 764
See application file for complete search history.

(56) References Cited

U.S. PATENT DOCUMENTS

| | | | | | |
|---|---|---|---|---|---|
| 1,848,717 | A | * | 3/1932 | Heline | 294/93 |
| 3,137,065 | A | * | 6/1964 | Harris | 29/278 |
| 3,617,083 | A | * | 11/1971 | Koppensteiner et al. | 294/15 |
| 3,626,575 | A | * | 12/1971 | Greenspan | 29/764 |
| 3,696,492 | A | * | 10/1972 | Baillard | 29/758 |
| 3,903,576 | A | * | 9/1975 | Stein | 29/764 |
| 5,193,269 | A | * | 3/1993 | Dattilo | 29/764 |

\* cited by examiner

*Primary Examiner*—Dean J Kramer
(74) *Attorney, Agent, or Firm*—Winston Hsu

(57) ABSTRACT

A clamp tool for circuit board is disclosed. The clamp tool includes a frame, a handle, a plurality of gripping shafts, and a lock. The frame defines two vertical grooves facing each other. The handle is mounted on top of the frame. The gripping shafts are mounted beneath the frame, and include protuberant gripping heads on an end thereof. The lock includes a pull rod and a locking shaft. The pull rod passes through the vertical grooves and connects with the frame by elastic pieces. The locking shaft is mounted beneath the pull rod. The clamp tool is used to move circuit boards.

7 Claims, 7 Drawing Sheets

CLAMP TOOL FOR CIRCUIT BOARD

BACKGROUND

1. Technical Field

The present invention relates to a clamp tool for circuit board.

2. General Background

Circuit boards often have to be transported/moved when assembling computers. Each circuit board includes many electronic components. The circuit board, especially a main circuit board, has a large surface and a thin thickness. Thus moving the circuit boards are inconvenient.

Therefore, what is needed is a clamp tool for circuit boards.

SUMMARY

A clamp tool for circuit board is disclosed. The clamp tool includes a frame, a handle, a plurality of gripping shafts, and a locking means. The frame defines two vertical grooves facing each other. The handle is mounted on top of the frame. The gripping shafts are mounted beneath the frame, and include protuberant gripping heads on an end thereof The locking means includes a pull rod and a locking shaft. The pull rod passes through the vertical grooves and connects with the frame by elastic pieces. The locking shaft is mounted beneath the pull rod.

Further features and advantages will be provided or will become apparent in the course of the following detailed description.

DETAILED DESCRIPTION OF THE EMBODIMENT

Figure 1:
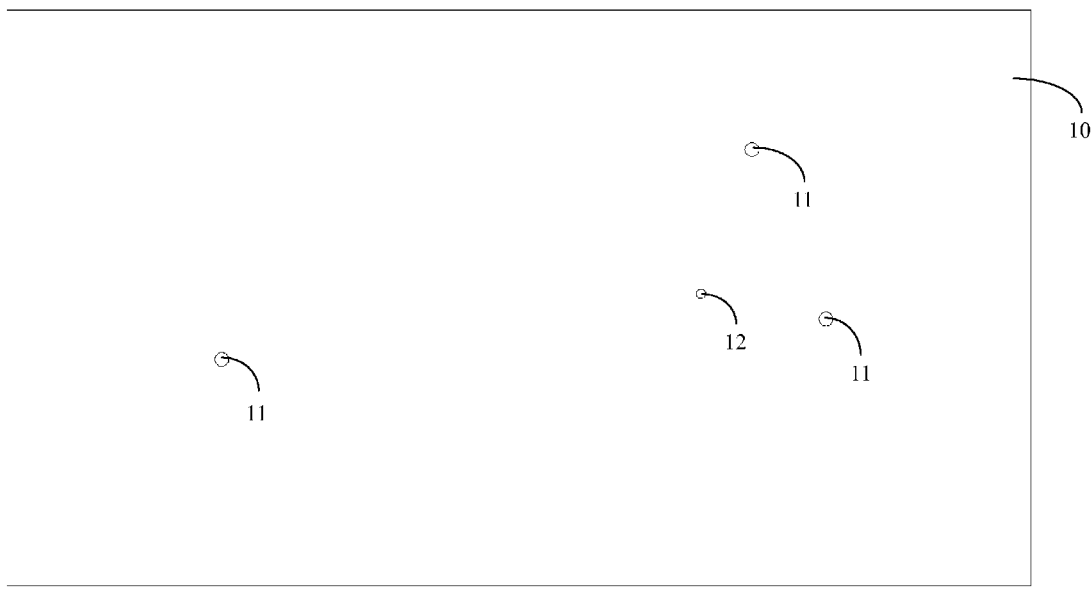
FIG. 1 is a schematic, front view of a main circuit board.

Referring to FIG. 1, a main circuit board 10 is disclosed. The main circuit board 10 includes various electronic components (not shown). The main circuit board 10 defines three gripping holes 111 and a locking hole 12.

Figure 2:
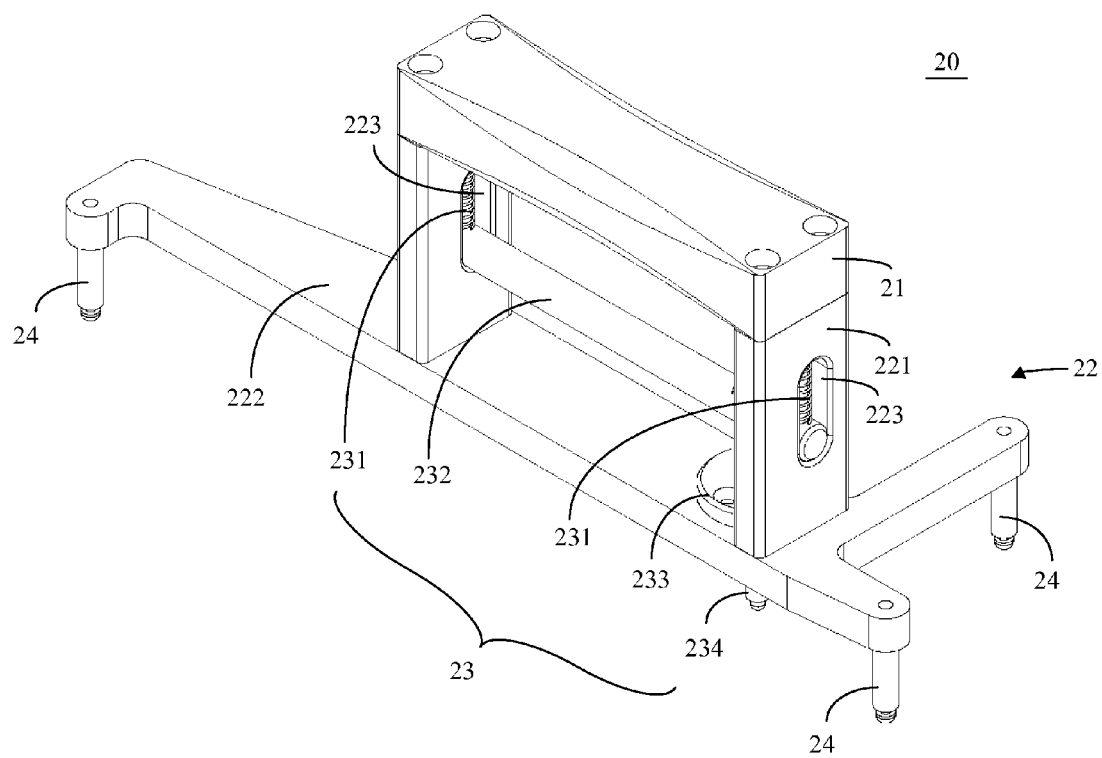
FIG. 2 is a schematic, isometric view of a clamp tool according to a preferred embodiment of the present invention.
Figure 3:
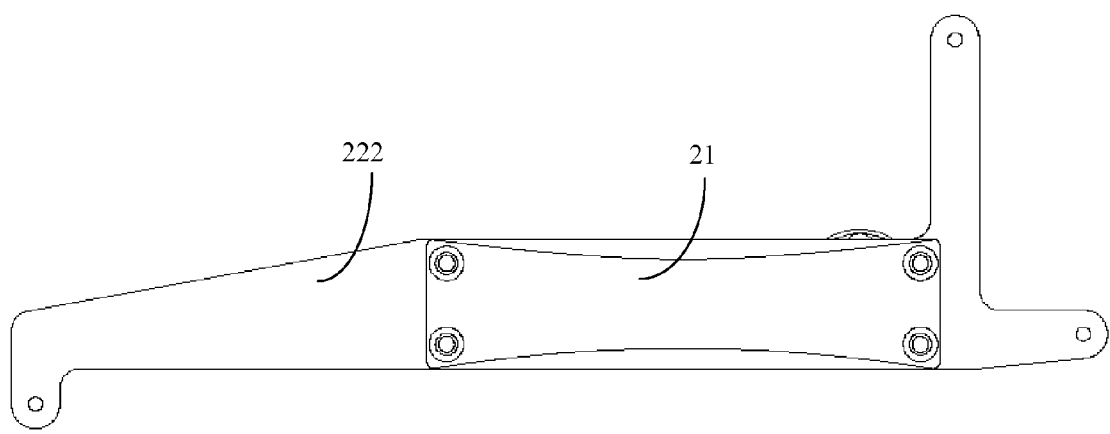
FIG. 3 is a schematic, top view of the clamp tool of FIG. 2.

Referring to FIG. 2, a clamp tool 20 according to a first embodiment of the present invention is disclosed. The clamp tool 20 includes a handle 21, a frame 22, a locking means 23, and three gripping shafts 24. The frame 22 includes two vertical portions 221 and a horizontal portion 222. The handle 21 is mounted on the top of the vertical portions 221. Each vertical portion 221 defines a vertical groove 223. The horizontal portion 222 is extended from the bottom of the vertical portions 221, and forms a "T"-shaped body.

Figure 5:
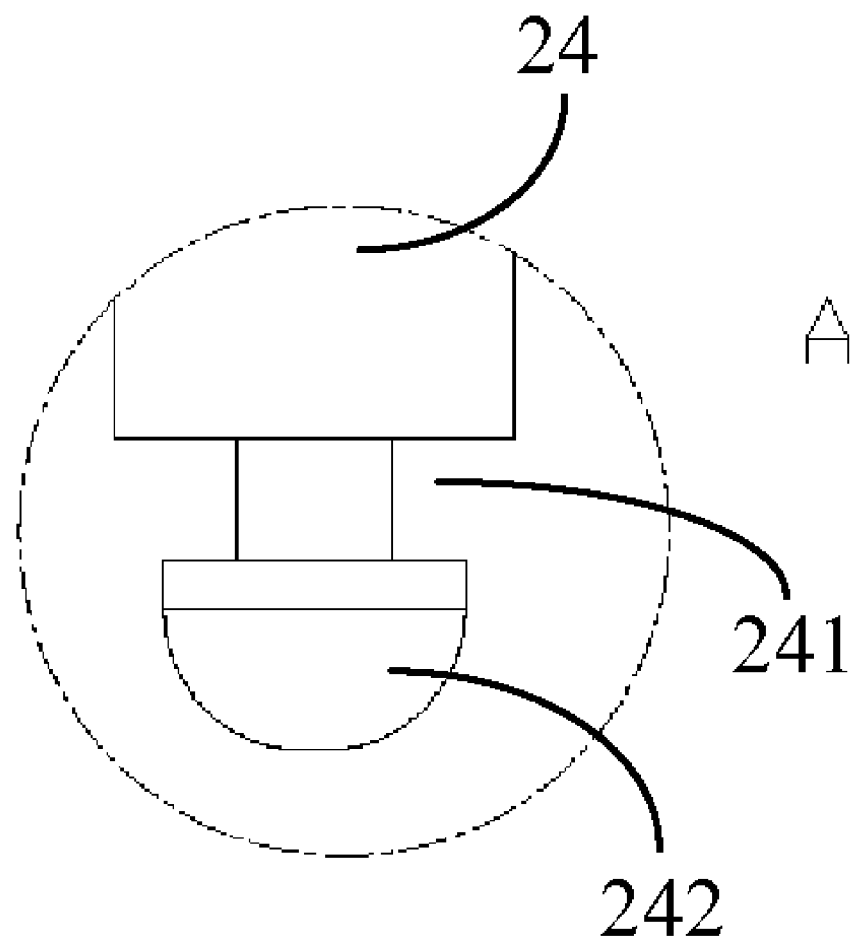
FIG. 5 is a schematic, partial enlarged view of the clamp tool of FIG. 4.

The gripping shafts 24 are mounted beneath the horizontal portions 222. The gripping shafts 24 are configured on the clamp tool 20 at predetermined positions corresponding to the gripping holes 11 such that centers of the of the gripping shafts 24 are aligned with centers of the gripping holes 11 correspondingly. Referring to FIG. 5, each of the gripping shafts 24 include a gripping head 242 on an end of the gripping shafts 24, and a groove (neck) 241 adjacent to the gripping head 242. The gripping head 242 is protuberant. Diameters of the gripping heads 242 are slightly smaller than diameters of the gripping holes 111 of the main circuit board 10.

Figure 4:
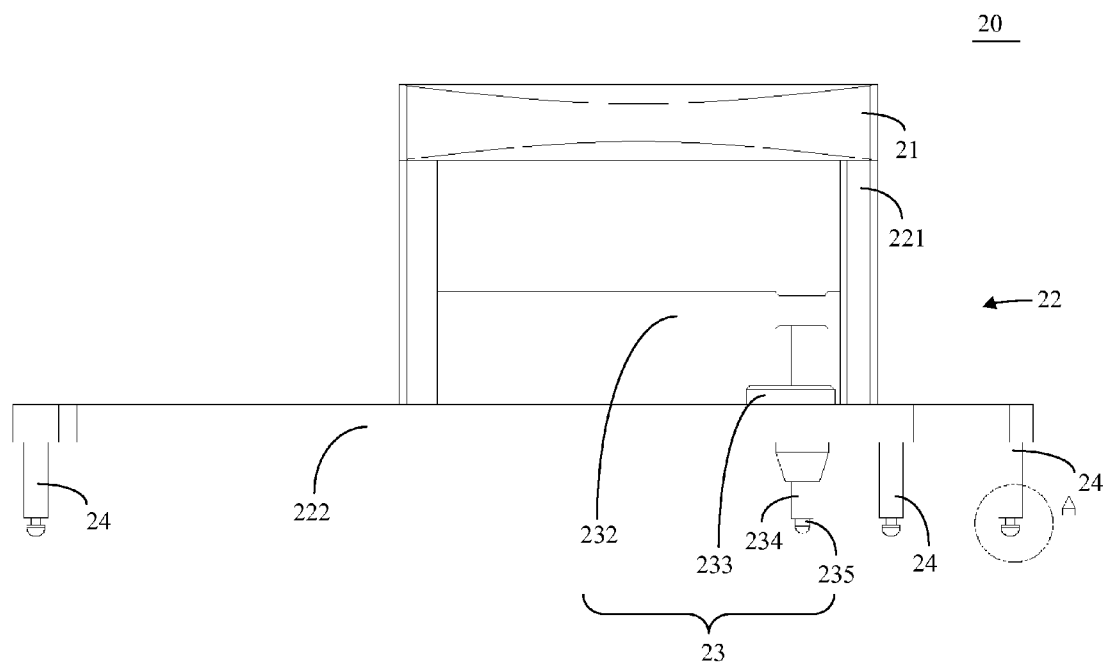
FIG. 4 is a schematic, front view of the clamp tool of FIG. 2.

Referring to FIG. 4, the locking means 23 includes a pull rod 232, a block 233, and a locking shaft 234. Two ends of the pull rod 232 are positioned in the vertical grooves 223 and are connected with the vertical portions 221 by elastic pieces 231 (see FIG. 2). In this embodiment of the present invention, the elastic pieces 231 are springs. An end of the locking shaft 234 is mounted beneath the pull rod 232. The locking shaft 234 passes through the block 233 fitted on the horizontal portion 222. The block 233 is made of rubber. The block 233 is configured to allow the locking shaft 234 move smoothly. The locking shaft 234 is parallel to the gripping shafts 24. The locking shaft 234 is configured such that when centers of the gripping shafts 24 are aligned with centers of the gripping holes 11, a center of the locking shaft 234 is misaligned (off centered) with a center with the locking hole 12 no more than a radial distance between the gripping head 242 and the groove 241 of the gripping shaft 24. The locking shaft 234 includes a thin end 235. A diameter of the end 235 is equal to a diameter of the locking hole 12.

Figure 6:
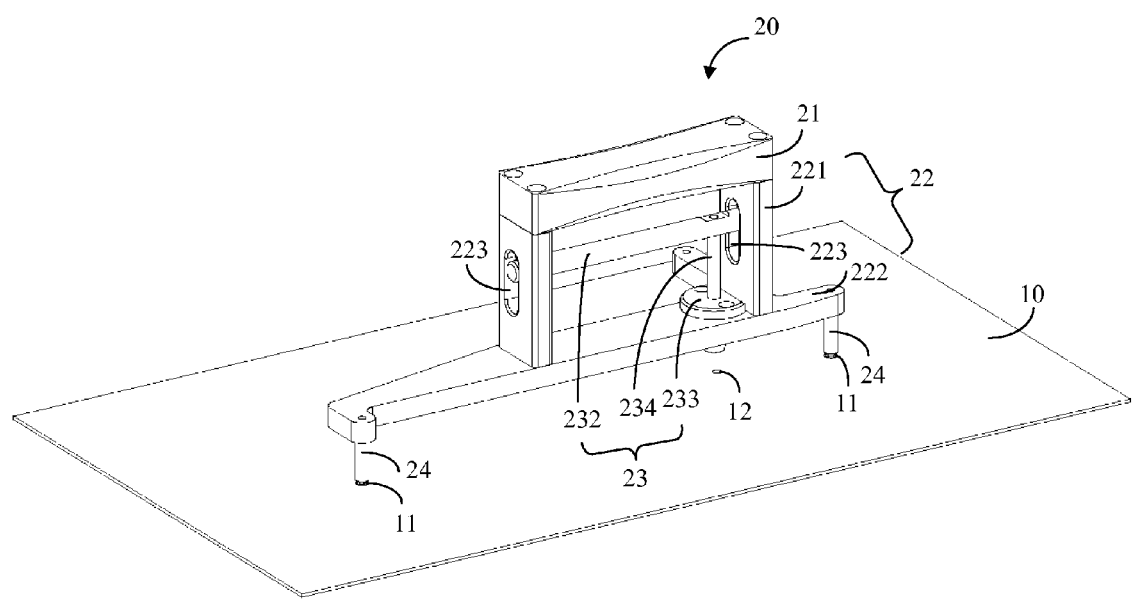
FIGS. 6 and 7 are schematic, isometric view of the clamp tool of FIG. 2 clamping the main circuit board of FIG. 1.
Figure 7:
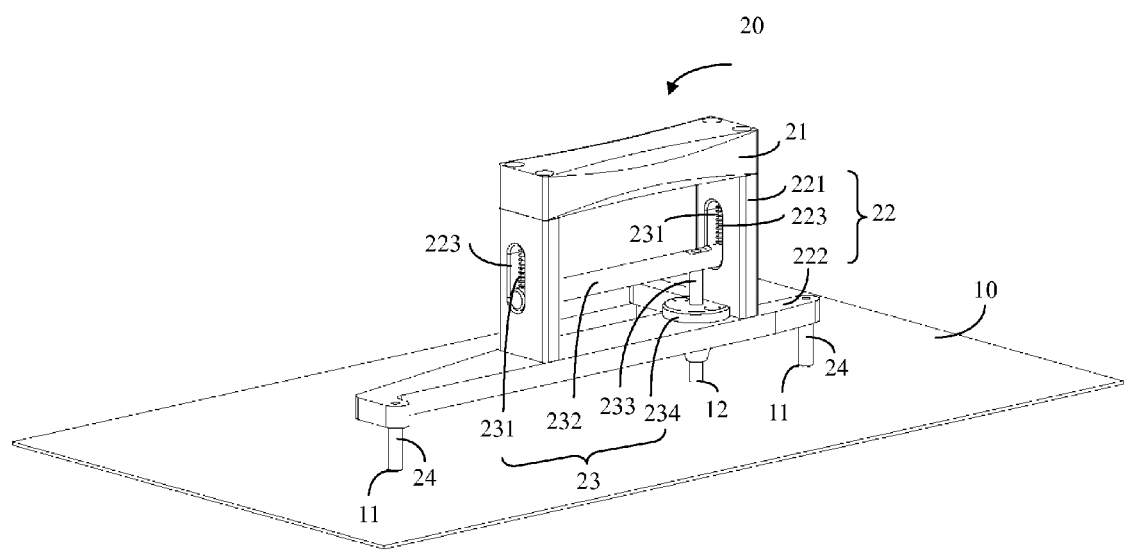

FIGS. 6 and 7 show how to clamp the main circuit board 10 by using the clamp tool 20. First, hold the handle 21 and pull up the pull rod 232, thus lift up the locking shaft 234. Secondly, insert the gripping shafts 24 into the gripping holes 11 till the gripping heads 242 fully pass through the gripping holes 11 and are exposed below a bottom surface of the main circuit board 10. Thirdly, position the clamp tool 20 such that the grooves 241 engage with sides of the gripping holes 11 and the gripping heads 242 contact the bottom surface of the main circuit board 10. Fourthly, relax the pull rod 232, and the locking shaft 232 moves down correspondingly and the end 235 of the locking shaft 232 enters into the locking hole 12. Because the diameter of the end 235 is equal to the diameter of the locking hole 12, the clamp tool 20 can't be moved horizontally relative to the main circuit board 10. Because the gripping heads 242 contact the bottom surface of the main circuit board 10, the clamp tool 20 can't be separated from the main circuit board 10. Fifthly, move the main circuit board 10 and the clamp tool 20.

Moreover, it is to be understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clamp tool adapted for a circuit board comprising:
   a frame defining two vertical grooves facing each other;
   a handle mounted on top of the frame;
   a plurality of gripping shafts mounted beneath the frame, including protuberant gripping heads on an end thereof and
   a locking means comprising:
      a pull rod passing through the vertical grooves and connecting with the frame by elastic pieces, the elastic pieces being above the pull rod;
      a locking shaft mounted beneath the pull rod; and
      a block mounted on the frame, wherein the locking shaft passes through the block.

2. The clamp tool for circuit board of claim 1, wherein the elastic pieces are springs.

3. The clamp tool for circuit board of claim 1, wherein a number of the gripping shafts is three.

4. The clamp tool for circuit board of claim 1, wherein the locking shaft is parallel to the gripping shafts.

5. The clamp tool for circuit board of claim 1, wherein the locking shaft comprises a thin end.

6. The clamp tool for circuit board of claim 1, wherein the gripping shafts define grooves adjacent to the gripping heads.

7. The clamp tool for circuit board of claim 1, wherein the frame comprises a horizontal portion and two vertical portions elongated upwardly from the horizontal portion.

* * * * *